United States Patent [19]
Hubacher et al.

[11] Patent Number: 5,762,259
[45] Date of Patent: Jun. 9, 1998

[54] METHOD FOR FORMING BUMPS ON A SUBSTRATE

[75] Inventors: Eric M. Hubacher, Austin; Karl G. Hoebener, Georgetown, both of Tex.

[73] Assignee: Motorola Inc., Schaumburg, Ill.

[21] Appl. No.: 848,792

[22] Filed: May 1, 1997

Related U.S. Application Data

[63] Continuation of Ser. No. 497,884, Jul. 3, 1995, abandoned.

[51] Int. Cl.$^6$ .............. B23K 35/00; H01L 21/441
[52] U.S. Cl. ............ 228/180.22; 228/248.1; 228/254; 437/183
[58] Field of Search ............ 228/248.1, 232, 228/180.22, 254; 437/183

[56] References Cited

U.S. PATENT DOCUMENTS

| | | | |
|---|---|---|---|
| 4,865,654 | 9/1989 | McLellan | 228/232 |
| 5,048,747 | 9/1991 | Clark et al. | 228/180.2 |
| 5,219,117 | 6/1993 | Lin | 228/253 |
| 5,281,684 | 1/1994 | Moore et al. | 427/96 |
| 5,346,118 | 9/1994 | Degani et al. | 228/180.22 |
| 5,492,266 | 2/1996 | Hoebener et al. | 228/180.22 X |

FOREIGN PATENT DOCUMENTS

| | | | |
|---|---|---|---|
| 0 565 908 A3 | 10/1993 | European Pat. Off. | H01L 21/48 |
| 26030 | 1/1990 | Japan | 437/183 |
| 236241 | 10/1991 | Japan | 437/183 |
| 3-225923 | 10/1991 | Japan | H01L 21/321 |
| 5-090271 | 4/1993 | Japan | H01L 21/321 |
| 6-168949 | 6/1994 | Japan | H01L 21/321 |
| 6-232134 | 8/1994 | Japan | H01L 21/321 |

OTHER PUBLICATIONS

John R. Morris and Thaddeus Wojcik, "Stencil Printing of Solder Paste for Fine–Pitch Surface Mount Assembly", IEEE Transact ions on components, Hybrids and Manufacturing Technology, Sep. 1991, vol. 14, No. 3, pp. 560–566.

*Primary Examiner*—Kenneth J. Ramsey
*Attorney, Agent, or Firm*—Patricia S. Goddard; Jeffrey S. Abel

[57] ABSTRACT

Solder bumps are formed on a substrate, such as a semiconductor die (28) or wafer, using a screen printing and reflow operation. Solder paste (18) is screened into openings (14) of a stencil (10). The paste is reflowed within the stencil to produce a solder preform (22). The stencil and solder preforms are then aligned over the substrate to be bumped so that the preform aligns with a metal pad (30) on the substrate. The solder preforms are again reflowed, and the solder within the openings of the stencil is drawn onto the metal pad. To facilitate the transfer of the solder from the stencil to the metal pad, a second stencil (12) can be used to form a protrusion (27) on the solder preform. The protrusion contacts the metal pad during the transfer reflow operation to facilitate removing the solder from the stencil.

20 Claims, 3 Drawing Sheets

METHOD FOR FORMING BUMPS ON A SUBSTRATE

This application is a continuation of prior patent application Ser. No. 08/497,884 filed Jul. 3, 1995 now abandoned.

CROSS-REFERENCE TO RELATED APPLICATION

The present invention is related to subject matter of a co-pending application by K. Hoebener et al. entitled, "Fine Pitch Solder Deposits on Printed Circuit Board Process and Product," Ser. No. 08/298,983, filed Aug. 31, 1994, and assigned to the Assignees of the present application.

FIELD OF THE INVENTION

The present invention relates to methods for forming conductive bumps on a substrate, for instance for forming solder bumps on a semiconductor substrate or printed circuit board.

BACKGROUND OF THE INVENTION

Flip chip bonding is becoming a popular packaging alternative to conventional wire bonding and tape automated bonding (TAB) processes. In flip chip bonding, interconnections between input and output (I/O) terminals of a semiconductor die or chip and a user substrate (such as a printed circuit board) are made by conductive bumps that are formed on an active surface of the semiconductor die. Advantages of using flip chip bonding over other interconnect methods include: increased I/O terminal density, which results in a smaller device "footprint," increased signal propagation speed due to short interconnections, reduced vertical profile, and lower device weight.

Several different methods for forming conductive bumps for a flip chip device have been proposed. One of the most accepted methods for forming the bumps is through an evaporative deposition process utilizing a mask. In this process, a mask is made to have a plurality of openings extending through the mask and corresponding in pattern to the I/O terminal configuration of the device to be bumped. The mask is aligned with the semiconductor device, and one or more metals are evaporated with the mask in place. During evaporation, metal is deposited onto the semiconductor die through the openings of the mask, without being deposited on the device in other areas. In a typical evaporation process, thin layers of chrome, copper, and gold are first deposited sequentially, followed by thicker depositions of lead and tin, respectively. After all of the metals having been sufficiently deposited, the mask is removed. The lead and tin which have been deposited onto the terminal pads are then reflowed to form a final solder bump shape and composition. While the evaporative process has the advantages of producing high quality and uniform volume conductive bumps on the semiconductor die, or other substrate, the process also has a few manufacturing disadvantages. One disadvantage is that the length of time it takes to evaporate the metals and the large capital investment necessary to perform the process significantly increase the cost of die manufacturing.

More simplified processes to form conductive bumps have been proposed which utilize screen or stencil printing of the bump pattern. Rather than evaporating metal through a mask, a solder paste (or alternatively a conductive polymer) is screened over a mask or stencil having openings which correspond to the pattern of the metal pads to be bumped. The screening occurs while the stencil is positioned and aligned on the substrate to be bumped, with the intent that the solder paste fills the openings and also wets the underlying metal pads. After filling, the stencil is then removed from over the device with the hope that all the solder paste remains on the terminal pads. In practice, however, a good bit of the solder paste is removed with the stencil rather than remaining on the metal pads due to the stickiness of the solder paste and the narrow dimensions of the stencil openings. Not only does this result in material waste, but the removal of solder paste by the stencil is also difficult to predict. Even if a process were optimized to account for removal of paste by the stencil, the process could not be performed repeatedly with consistent results. Furthermore, the amount of solder paste which is removed by the stencil is not always uniform across the entire stencil. Thus, some solder bumps formed will have larger or smaller volumes of solder than other bumps. Non-uniformity of bump volume creates a problem with subsequent processing operations, specifically with attaching a flip chip die to a user substrate such as a printed circuit board. Upon positioning a die next to the substrate for attachment, not all solder bumps will make contact to the pads on the user substrate and thus will be remain open even after a reflow operation is performed to attach the die.

In view of the through-put and cost concerns which exist with existing evaporative conductive bump processes and the uncontrollability of conductive bump volume in conventional stencil or screen printing formation processes, an improved process would be desirable. More specifically, it would be desirable to have a process for forming conductive bumps which can be performed at a low cost, with adequate through-put rates, and with a high degree of controllability of the final bump shape, size, and volume.

DETAILED DESCRIPTION OF A PREFERRED EMBODIMENT

Figure 1:
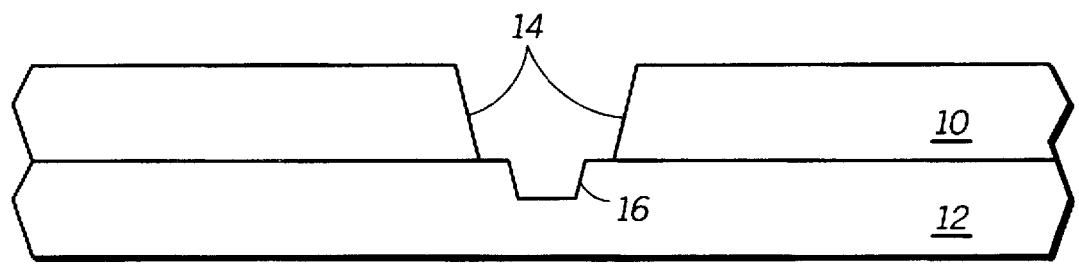
FIGS. 1–10 illustrate in cross-section, and in sequence, a process for forming conductive bumps on a semiconductor device, in accordance with one embodiment of the present invention.

Generally, the present invention is a method forming conductive bumps on a substrate, such as a semiconductor die or wafer, which utilizes a stencil and a screening operation. However, unlike prior art processes which also utilize stencils and screening, the present invention is able to achieve uniform conductive bump volumes across the substrate being bumped. Volume control is achieved by tailoring the size and shape of the openings within the stencil and by reflowing a solder paste which fills the openings in the stencil while the stencil is in position over the substrate to be bumped. In other words, the stencil is not removed after screening the solder paste in the openings. Instead, solder paste is screened into the openings of the stencil. The stencil is then positioned on the substrate to be bumped, and the solder paste is reflowed while the stencil remains positioned over the substrate. After reflow, the stencil is removed.

In more specific embodiments of the present invention, two stencils are used to form the conductive bumps. A first stencil is made to include openings which extend entirely through the stencil and correspond in pattern to metal pads of the substrate which are to be bumped. A second stencil is formed to include recesses which do not extend entirely through the second stencil, but which also correspond in pattern and location to the openings in the first stencil and to the metal pads of the substrate to be bumped. The first and second stencil are aligned such that the openings and recesses correspond. Solder paste is then screened into both the openings and the recesses. At this point, the solder paste is reflowed within the stencils to create solder preforms. In a preferred embodiment, the solder preforms have the shape of a truncated cone having a protrusion at its apex. After forming the solder preforms, the second stencil is removed from the first stencil such that the protrusion of each preform is exposed. The first stencil is then aligned to the substrate to be bumped such that the protrusion of the each solder preform contacts one of the metal pads on the substrate. At this point, the solder preforms are again reflowed. Upon reflow, the solder protrusion which is in the contact with the metal pad wets the metal pad and draws the remaining solder from within the opening of the first stencil onto the pad to form the conductive bump.

Because the inventive process relies upon a reflow operation to draw all of the solder out of precisely defined stencil openings, the volume of solder which finally forms the conductive bumps can be well controlled and repeatedly produced with consistent results. Also, because openings can be made uniformly within the stencil, the resulting bumps likewise will have uniform volumes across the entire substrate bumped. Furthermore, the size and configurations of the openings in the stencil or stencils can be designed to further facilitates the containment and release of a controlled amount of solder.

These and other features and advantages of the present invention will become more clearly understood from the following detailed description taken in conjunction with the accompanying drawings. It is important to point out that the illustrations are not necessarily drawn to scale, and that there are likely to be other embodiments of the present invention which are not specifically illustrated. Furthermore, it is important to note that like reference numerals are sometimes used throughout the several figures to designate identical or corresponding parts.

FIGS. 1–10 illustrate in cross-section how a stencil is used to form conductive bumps on a substrate in accordance with one embodiment of the present invention. In a preferred embodiment of the present invention, solder is the material which forms the conductive bumps. Illustrated in FIG. 1 are portions of a first stencil 10 and a second stencil 12. Both the first and second stencil are made from a material which is non-wettable by solder, or whatever other material may be used to form the conductive bumps. Suitable stencil materials which can be used to form solder bumps include molybdenum, some stainless steels, and glass. Alternatively, other materials can be used for stencils which include an external oxide layer to provide the non-wettable surface. An opening 14 is formed in first stencil 10, while a recess 16 is formed in second stencil 12. Although only one opening and one recess are illustrated in FIG. 1 and in subsequent figures, in practice each stencil will have a plurality of such openings and recesses. Each opening, and its associated recess will correspond in pattern and location to a metal pad formed on the substrate to be bumped. Because in most instances multiple metal pads will be present on the substrate to be bumped, multiple openings and recesses will be needed in the stencil. However for simplicity of illustration and description, only one such opening is illustrated in FIGS. 1–10.

Opening 14 and recess 16 are formed in the stencils in accordance with conventional processes. For example, a photolithographic masking process followed by an etch suitable for the stencil material can be used to form the opening and recess. In a preferred embodiment, and as illustrated in FIG. 1, opening 14 and recess 16 have tapered or sloped sidewalls. Stated otherwise, the width of the opening at one surface of the stencil is larger than the width of the opening toward the opposing end of the stencil. Tapered sidewalls can be achieved in forming the openings and/or recesses according to conventional methods. For instance, an isotropic etch can be used which would etch the stencil material in more than one direction at once. The slope of the sidewalls is used to aid in the removal of the solder from within the opening, as will subsequently become apparent. However, it is noted that tapered sidewalls are optional features. Vertical sidewalls or sidewalls tapered in a direction opposite of that illustrated can instead by used in practicing the invention and may have their own manufacturing advantages.

Although FIGS. 1–10 illustrate a process utilizing two stencils, it should be noted that in practicing the present invention, it is possible to need only one stencil. Throughout this description, where processes for utilizing two stencils versus one stencil differ will be pointed out, as will advantages or disadvantages of each process at the various stages of the bump formation process. With respect to FIG. 1, second stencil 12 is the optional of the two stencils. In other words, in practicing the present invention utilizing only one stencil, that stencil should have a plurality of openings which extend completely through the stencil rather than having recesses which are formed only partially through the stencil.

Figure 2:
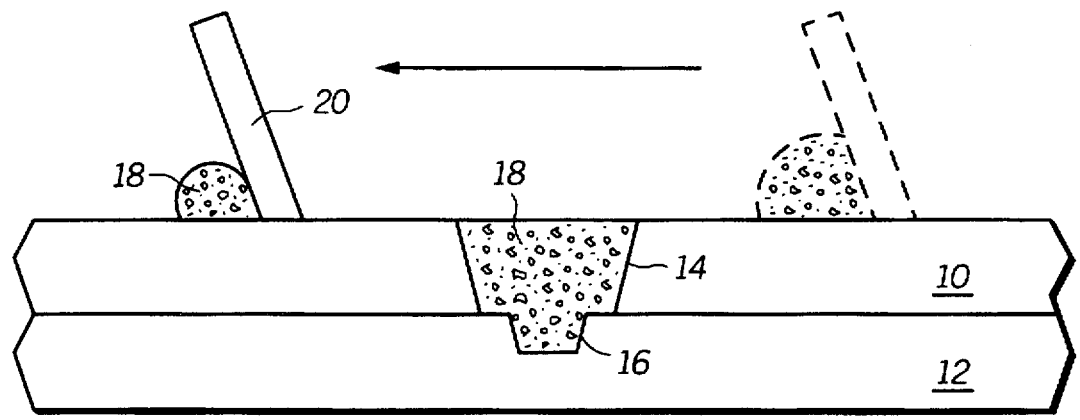

As illustrated in FIG. 1, first stencil 10 and second stencil 12 are aligned together such that each opening 14 is aligned to a corresponding recess 16. After the stencils are aligned, a solder paste 18 is screened across the stencils using a doctor blade or squeegee 20, as illustrated in FIG. 2. As the solder paste is moved over each opening and recess, the solder paste fills the opening and recess as illustrated. If only one stencil (stencil 10) is used, the bottom of the opening 14 would have to be covered to keep the solder paste within the opening. For example, a flat plate could be provided under stencil 10 (in place of stencil 12 as illustrated in FIG. 2) to contain the solder paste. Conventional solder pastes used for forming either high temperature solder (97% Pb, 3% Sn) or low temperature, eutectic solder (37% Pb, 63% Sn) can be used in accordance with the invention. The solder paste dispensed in the openings and recesses of the stencils will form the solder bumps on the substrate being bumped, therefore, whether a high temperature or low temperature solder is used will depend upon the desired final bump composition. In general, high temperature solder is usually used in applications in which the flip chip is attached to ceramic or other high temperature carriers, while low temperature solder is usually used in applications in which the flip chip is attached to organic or other low temperature carriers.

Figure 3:
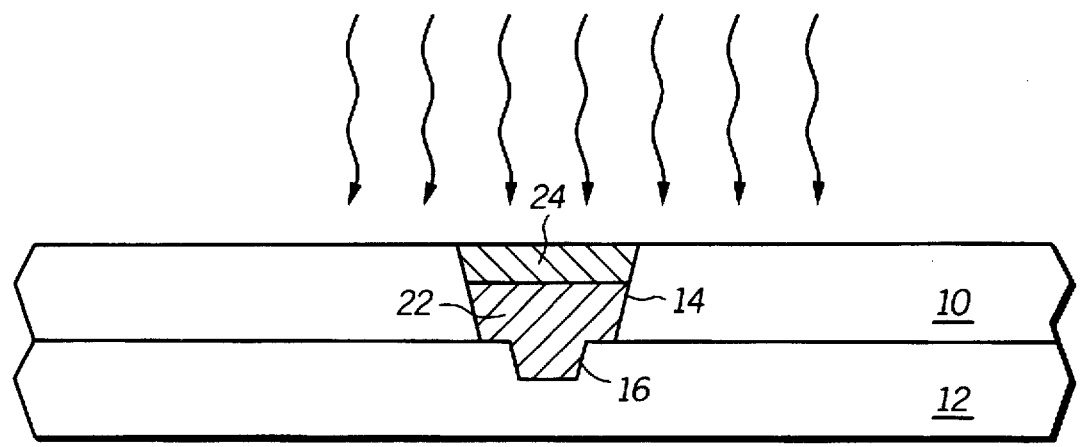

After filling the openings and recesses with the solder paste, the solder paste and stencils then undergo a thermal reflow operation as illustrated by FIG. 3. The reflow temperature used will depend upon the composition of the solder paste. During this reflow operation, lead and tin particles of the paste, which are dispersed within a flux and a binder material, alloy to form the solder material. The flux and binders of the solder paste come to the surface upon reflow. After reflowing and upon cooling, a solder preform 22 is formed within the opening and recess of the stencils. During reflow, the flux and binders within the solder paste rise to leave a hardened residue 24 above the solder preform and within the opening. If desired, a conventional flux cleaning operation can be used to remove the residue layer, but such a clean is not required at this stage in processing. Again, if only one stencil is used, some means of containing the solder within the opening during reflow should be used (e.g. an underlying non-wettable flat plate).

Because the reflow operation involves elevated temperatures, it is desirable that the material of the two stencils (if two stencils are used) have similar or nearly matched coefficients of thermal expansion (CTEs) so that the shape of the resulting preforms can be tightly controlled. Ideally, both stencils are made of the same material so that identical CTEs can be assured. Even though the volume of the solder dispensed within the openings would not change as a result of CTE mismatch, deformation or change in the shape of the preform is possible upon cooling and solidification of the solder.

Figure 4:
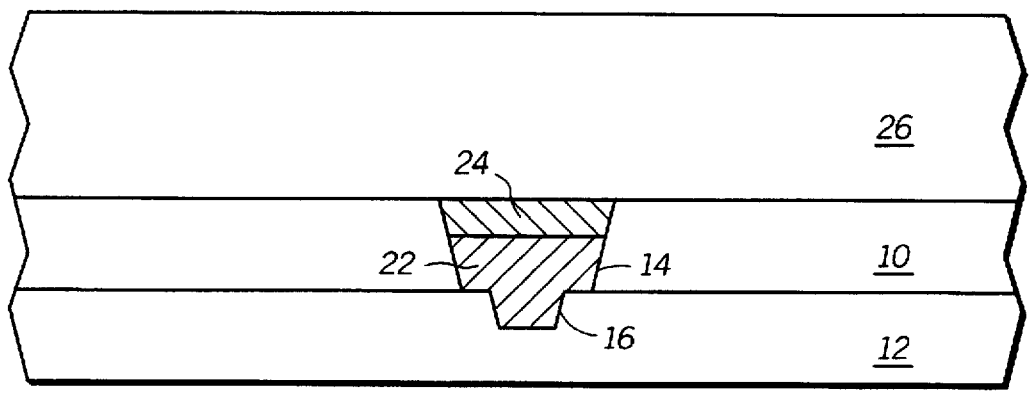
Figure 5:
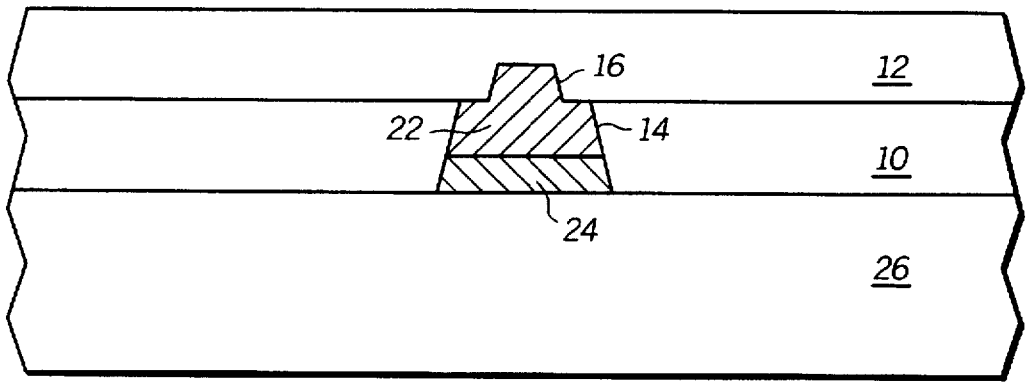
Figure 6:
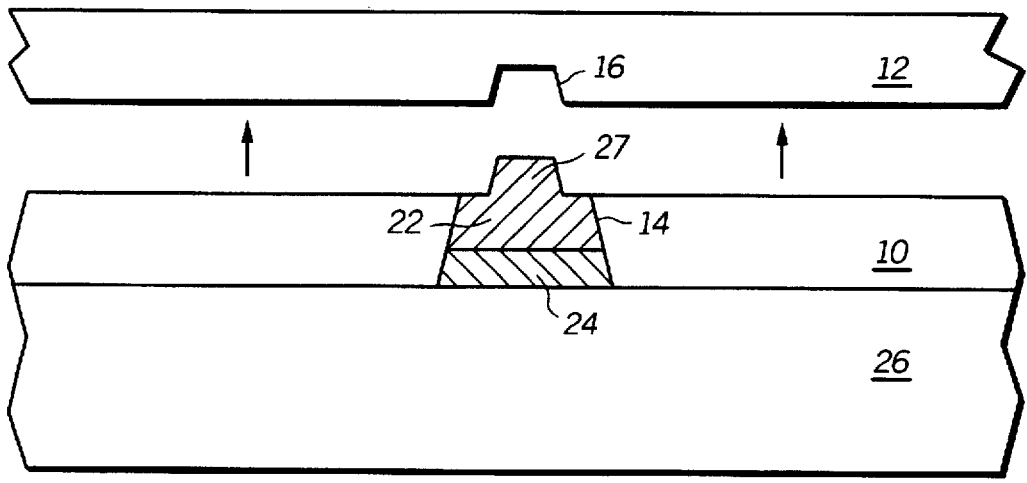

After reflowing the solder within the stencils, the second stencil is removed. From the configuration illustrated in FIG. 3, stencil 12 could simply be removed from beneath stencil 10. However, upon removing the lower stencil, the solder preform would be suspended within an opening 14 of the first stencil. If for some reason the first stencil were inverted, the solder preforms could possibly fall out of the openings since the preforms would not be supported from either the top or bottom of stencil 10. (Note that in the orientation illustrate in FIG. 3, the solder preforms could be suspended within the opening without external support due to the inward taper or slant in the opening sidewalls.) Accordingly, to prevent the solder preforms from inadvertently falling out of the openings, a flat plate 26 is positioned over first stencil 10 as illustrated in FIG. 4. The particular material of flat plate 26 is not particularly important since the plate is merely provided to establish physical security of the solder preforms within the openings of the first stencil. After providing flat plate 26, second stencil 12 may be removed. Again, the second stencil may be removed by pulling it from beneath stencil 10. Alternatively, the entire stack of first stencil 10, second stencil 12, and flat plate 26 can be inverted as illustrated in FIG. 5, and the second stencil 12 lifted off of the stacked structure as is indicated by FIG. 6.

Regardless of the manner in which stencil 12 is removed, the result is to expose a protrusion 27 of the solder preform. Protrusion 27 is created by the recess in the second stencil, thus if only one stencil is used the solder preform will have no such protrusion. As illustrated, the shape of protrusion is again a truncated cone, although other shapes, including a full cone, can be used. An advantage of using a conical shape (wherein the sidewalls of recess 16 are tapered) is to facilitate the removal of the stencil after formation of the solder preform.

Figure 7:
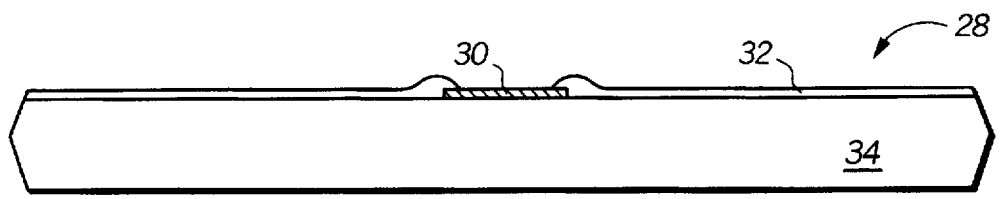

After forming the solder preforms and removing the second stencil if used, the solder preforms within the first stencil are then aligned to metal pads of the substrate to be bumped. Illustrated in FIG. 7 is a portion of a semiconductor die 28. Die 28 includes a metal pad 30, which may be an I/O terminal pad or a pad formed as part of a redistribution metal layer to convert an I/O terminal pad configuration into a suitable bump configuration. A final passivation layer 32 is also included on semiconductor die 28. Passivation layer 32 covers die 28 except where the metal pad or pads are located. Beneath metal pad 30 and passivation layer 32 may be any number of layers typically used in semiconductor die manufacturing, such as polysilicon layers, metal layers, tungsten plugs, interlevel dielectrics, silicon nitride layers, silicides, oxides, etc. For purposes of understanding the invention, these underlying layers are not important. Accordingly, further discussion is omitted. These underlying layers, metal pad 30, and passivation layer 32 are likely to all be formed on a semiconductor substrate material, such as a silicon or other semiconductor wafer. Collectively, the layers and base wafer substrate material are represented in FIG. 7 as a substrate 34.

Metal pad 30 is formed over substrate 34 in accordance with conventional processing. In one embodiment wherein conductive bumps are formed on a semiconductor wafer, metal pad 30 is formed of aluminum and has an overlying layer or layers of barrier metals. Suitable barrier metal layers include chrome, copper, gold, and/or a titanium copper alloy. The barrier metals are preferably plated onto the underlying aluminum layer by defined a photoresist over the substrate which protects or masks areas of the substrate not to be plated. In the case of forming conductive bumps on a printed circuit board, the underlying metal of metal pad 30 may be copper, having a gold-plated barrier layer formed thereon. Passivation layer 32 in a preferred form is a polyimide, but can instead be a silicon nitride or silicon dioxide layer deposited onto the substrate and patterned to expose the metal pads.

It should be noted that as illustrated in FIGS. 7–10, the solder preforms formed in stencil 10 are used to form conductive bumps on a semiconductor die. The semiconductor die is most likely going to be one of several die on a single semiconductor wafer. However, it is important to understand that the present invention is not limited to forming conductive bumps on a semiconductor die or wafer. The present invention can equally benefit the formation of conductive bumps onto other substrates, such as printed circuit boards. The present invention as subsequently described in transferring the solder preforms to the metal pads of the semiconductor die apply equally to transferring solder preforms to metal pads of another substrate. In other words, no addition process steps of modifications to the subsequent steps described would be needed for forming bumps on another type of substrate.

Figure 8:
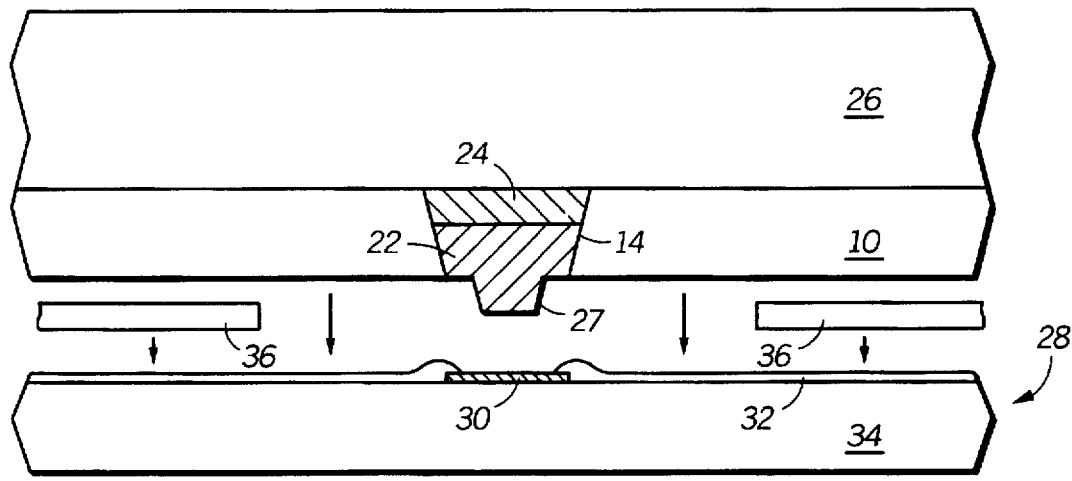

After providing the semiconductor die, wafer, or other substrate to be bumped, stencil 10 is positioned over the substrate and aligned such that the solder preform location corresponds in position to metal pad 30, as illustrated in FIG. 8. Also illustrated in FIG. 8, is a spacer 36. Spacer 36 is provided to establish a standoff between stencil 10 and semiconductor die 28. Stencil 10 is brought toward semiconductor die 28 until it rests on spacer 36. Accordingly, the distance separating stencil 10 and semiconductor die is equal to the thickness or height of the spacer. Preferably, the height of the spacer is slightly smaller than the height of protrusion 27. The standoff established by the spacer is advantageous because it allows protrusion 27 to come into physical contact with metal pad 30, while at the same time providing clearance for the solder to be transferred cleanly from the stencil onto the metal pad upon subsequent reflow without remaining in the stencil opening (as discussed further in reference to FIG. 9 below).

As illustrated in FIG. 8, spacer 36 contains an open region to accommodate the contact of protrusion 27 to metal pad 30. However, it is important to note that in a preferred form, spacer 36 is in a ring configuration around the periphery of the entire substrate which is to be bumped. For example, in the context of bumping a semiconductor wafer, spacer 36 would be in the form of a circular ring near the wafer perimeter and surrounding all die formed on the wafer. It is not necessary for the spacer to be continuous, with openings only provided for each bump to be formed, as FIG. 8 may suggest. A simple peripheral spacer shape is sufficient to provide the desired standoff, and has the advantages of keeping alignment of the spacer non-critical and keeping the manufacturing cost of the spacer very low. The material chosen for spacer 36 is not critical since the spacer serves only a standoff function. However, the spacer will be subjected to an elevated temperature operation, as will be discussed below. Accordingly, thermal expansion of the material used for the spacer in the vertical direction (i.e., the direction at establishes the standoff height) should be taken into account for an optimized process that assures contact is maintained between protrusion 27 and metal pad 30. Suitable materials for spacer 36 include molybdenum, titanium, stainless steel, or other materials having fairly low coefficient of thermal expansion in the 'z' direction.

If only one stencil is used, protrusion 27 will not exist and a spacer to accommodate the protrusion and provide a standoff is not necessary. Instead, the stencil and solder preform formed therein are placed directly on top of the substrate to be bumped. Preferably, the solder preform is able to make some physical contact with the metal pad of the substrate. However, the surface topography (being that it is probably not perfectly planar) is likely to complicate the ability to make contact between the solder preforms and metal pad in the absence of a protrusion, at least as between all solder preforms and all metal pads. In this regard, the use of two stencils to create protrusions has an advantage over using only one stencil.

Figure 9:
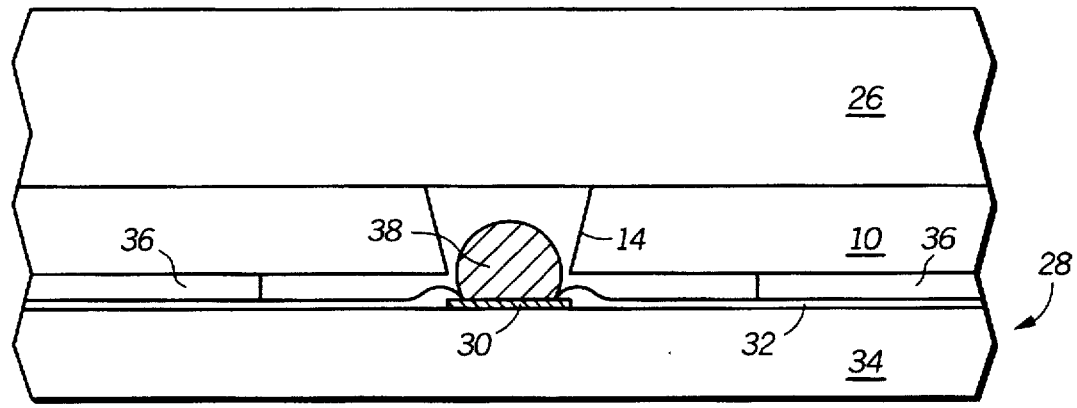

After aligning the stencil and solder preforms over the semiconductor die or other substrate to be bumped, the entire structure (e.g. the semiconductor die 28, the spacer 36, first stencil 10, solder preforms 22, and flat plate 26) is subjected to another reflow operation. This time, the reflow operation is not to alloy lead and tin particles in the solder paste to form preforms, but instead is to transfer the solder from the solder preforms onto the metal pad. Because protrusion 27 is in physical contact with the metal pad prior to the reflow operation, upon heating the solder will wet the metal pad. As the solder melts or reflows, capillary and gravitational forces will draw the solder from within opening 14 of stencil 10 down to and on metal pad 30, as illustrated in FIG. 9. Because the solder at this point is in a molten or liquid state, the solder takes on the rounded shape shown. Any residue material which might be part of the solder preforms is also transferred onto the semiconductor die (although it is not illustrated). A conventional flux or residue cleaning operation can be performed on the die or wafer upon hardening of the transferred solder to remove unwanted residue from the substrate.

As FIG. 9 illustrates, spacer 36 provides a standoff sufficient to permit removal of all of the solder within opening 14 of first stencil 10. In other words, there is a sufficient gap between the substrate being bumped and the stencil to allow the solder to be drawn from the stencil opening onto the metal pad without leaving solder along the sidewalls of the stencil opening. As a result of the solder transfer process, a solder bump 38 is formed on metal pad 30. As illustrated, it is also noted that solder bump 38 has a diameter or width which is less than the diameter of the narrowest portion of opening 14. This enables stencil 10 to be lifted off of semiconductor die 28 after the solder transfer operation, without disturbing the solder bump which is formed. To insure that the size of the solder bump formed will be smaller than the narrowest portion of opening 14, the volume of solder within opening 14 should be controlled. Upon choosing a desired final solder bump volume, the appropriate dimensions of opening 14 can be determined, based upon the volume composition of the solder paste which will be used to fill the stencil openings. For a given volume for each solder bump, the diameter of these bumps can likewise be determined, and the openings in the stencil and the spacer thickness can be designed to accommodate the bump diameter.

Figure 10:
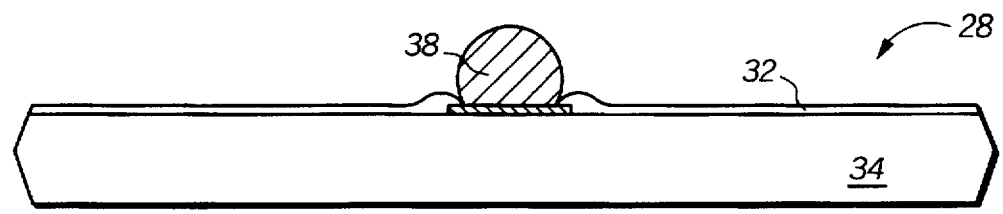

Once the solder has been transferred from within openings 14 of stencil 10 to metal pad 30, stencil 10 and flat plate 26 and spacer 36 are removed from above semiconductor die 28 and processing is complete. The resulting structure is a solder bumped die, as illustrated in FIG. 10.

If only one stencil (stencil 10) is being used to transfer solder to the metal pads, a spacer would not be used. Instead, the stencil would be placed directly on the substrate to be bumped, preferably so that the solder preforms make physical contact with the metal pads. The solder within the stencil would then be reflowed. Without a spacer, "drawing" of the solder from the stencil opening to the metal pad would not occur. Instead, the solder in the stencil would simply wet the metal pad during reflow, leaving the solder bound within the stencil opening. Upon cooling, a metallurgical bond between the solder and metal pad would be formed, but the solder (in the form of a hardened preform) would still be in the stencil opening. At this point the stencil would be lifted from above the substrate, leaving the solder on the metal pad. In order to achieve stencil liftoff without also removing solder, the sidewalls of the opening 14 in first stencil 10 would have to be either straight (vertical) or tapered outward (in a direction opposite that illustrated). Otherwise, the solder would be wedged into the stencil while also being metallurgically bonded to the metal pad, making stencil remove impossible. Capillary forces of the solder within the stencil openings could impeded the ability to remove the stencil without also removing some solder. Therefore, use of a two stencil process, or somehow otherwise achieving protrusions on the solder preforms, and using a standoff during the solder transfer process which permits drawing the solder from stencil openings is a preferred method for practicing the invention. Upon removing the stencil, an additional reflow operation could be performed to reshape the bumps on the metal pads into the free-formed rounded shape illustrated in FIG. 10. Without this additional reflow operation, the bumps on the metal pads would have the shape of openings in the stencil and would include any surface damage caused by removing the stencil. A subsequent reflow operation would lessen the effects of any induced solder bump damage.

Several advantages are achieved in practicing the present invention to form solder bumps on a semiconductor die or other substrate. One advantage is that costly evaporation, equipment and materials (for depositing solder) are avoided. Additionally, a simply screen printing operation in accordance with the present invention can be achieved much more quickly than if evaporation techniques were used to deposit lead and tin to form solder bumps. At the same time, the present invention has similar advantages to evaporation techniques with respect to high volume control and uniformity. The stencil or stencils used in practicing the present invention can precisely be designed to produce solder bumps of a given volume. Furthermore, it can be assured that all solder within the openings of the stencil is transferred to the metal pads of the substrate to be bumped. By reflowing the solder within the stencil openings while the stencil is in place over the substrate, a full transfer of all the solder within the openings to the metal pad is assured. The solder transfer from the stencil to the metal pad can further be facilitated by providing a protrusion of solder which physically contacts the metal pad and helps draw the solder from the stencil.

Thus, it is apparent that there has been provided in accordance with the invention a method for forming bumps on a substrate that fully meets the needs and advantages set forth previously. Although the invention has been described and illustrated with reference to specific embodiments, it is not intended that the invention be limited to these illustrative embodiments. Those skilled in the art will recognize that modifications and variations can be made without departing from the spirit of the invention. For example, the invention is not limited to the precise shape of the solder preforms illustrated. Nor does the invention require use of protrusions on a solder preform. In addition, the invention is not limited to the specific stencil, spacer, or flat plate materials described herein. Furthermore, conductive bumps can be formed of materials other than solder, such as conductive thermoplastic polymers. Nor is the invention limited to forming conductive bumps on any particular type of substrate. Therefore, it is intended that this invention encompass all such modifications and variations which fall within the scope of the appended claims.

We claim:

1. A method for forming bumps on a substrate comprising the steps of:

providing a semiconductor substrate having a plurality of metal pads;

providing a first stencil having a plurality of openings corresponding in pattern to the plurality of metal pads;

providing a second stencil having a plurality of recesses, each recess having a corresponding opening of the plurality of openings in the first stencil;

bringing together the first stencil and the second stencil such that each recess aligns with its corresponding opening;

filling the plurality of recesses in the second stencil with the solder;

filling the plurality of openings in the first stencil with a solder;

reflowing the solder in the plurality of recesses and in the plurality of openings to form a plurality of solder preforms;

removing the second stencil from the first stencil;

positioning the first stencil over the semiconductor substrate such that the plurality of openings with the plurality of solder preforms formed therein is aligned to the plurality of metal pads; and reflowing the solder preforms in the plurality of openings to form a solder bump on each of the plurality of metal pads.

2. The method of claim 1 wherein as a result of removing the second stencil, a protrusion is exposed for each solder preform.

3. The method of claim 2 wherein the step of positioning comprises positioning the first stencil over the semiconductor substrate such that the protrusion of each solder preform is in physical contact with a metal pad of the semiconductor substrate.

4. The method of claim 3 further comprising the step of placing a spacer in between the first stencil and the semiconductor substrate prior to the step of reflowing the solder preforms, wherein the spacer has a thickness less than a height of each protrusion.

5. A method for bumping a semiconductor wafer comprising the steps of:

providing a semiconductor wafer having a plurality of bump pads formed on a surface thereof;

providing a stencil made of a material that is non-wettable by a solder, the stencil having a plurality of openings, each opening having a uniform, controlled volume and including a recess;

dispensing the solder into the plurality of openings of the stencil;

firstly reflowing the solder in the stencil to form a plurality of solder preforms, each solder preform corresponding in size and shape to its respective opening including having a protrusion formed as a result of the recess;

positioning the stencil adjacent the semiconductor wafer such that the plurality of solder preforms aligns with and contacts the plurality of bumps pads via the protrusion of each solder perform; and secondly reflowing the plurality of solder preforms while the stencil is still adjacent the semiconductor wafer to form a solder bump on each bump pad of the plurality of bumps pads.

6. The method of claim 5 wherein the step of providing a stencil comprises providing a stencil wherein each opening of the plurality of openings has a shape comprised of a truncated cone.

7. The method of claim 5 wherein the step of providing a stencil comprises providing a first stencil and a second stencil, wherein the first stencil defines the plurality of openings and the second stencil defines the recess of each opening, and wherein each opening of the plurality of openings extends completely through a thickness of the first stencil, wherein each opening has a first end at a first surface of the first stencil having a first width and has a second end at a second surface of the first stencil having a second width smaller than the first width, and wherein the step of positioning comprises positioning the first stencil over the semiconductor wafer such that second surface of the first stencil is closer to the semiconductor wafer than the first surface.

8. The method of claim 5 wherein the step of providing a stencil comprises providing a stencil wherein each opening of the plurality of openings has an opening width at a surface of the stencil which is adjacent the semiconductor wafer during the step of positioning, and wherein upon secondly reflowing, each solder bump has a bump width, and wherein the opening width of each opening is larger than the bump width of its corresponding solder bump.

9. The method of claim 5 wherein the step of providing a stencil comprises providing a first stencil, and further comprising the steps of:

providing a second stencil having the recess for each opening formed partially therethrough;

aligning the first stencil to the second stencil; and dispensing the solder into the plurality of recesses in the second stencil;

wherein the step of firstly reflowing comprises firstly reflowing the solder in both the first and second stencils to form the plurality of solder preforms, including the protrusion for each solder preform.

10. The method of claim 9 further comprising the step of removing the second stencil to expose the protrusion on each solder preform, and wherein during the step of positioning, the protrusion of each solder preform is brought into physical contact with a bump pad of the semiconductor wafer.

11. The method of claim 10 further comprising the step of inserting a spacer between the semiconductor wafer and the first stencil, wherein the spacer is present during the step of secondly reflowing.

12. A method for forming bumps on a substrate comprising the steps of:

providing a substrate having a plurality of terminal pads;

providing a first stencil having a plurality of openings extending therethrough and corresponding in location to the plurality of terminal pads;

providing a second stencil having a plurality of recesses corresponding in location to the plurality of openings;

aligning the first stencil with the second stencil such that the plurality of recesses aligns with the plurality of openings;

dispensing solder into the plurality of openings and into the plurality of recesses;

reflowing the solder in the first stencil and the second stencil to form a plurality of solder preforms;

removing the second stencil, leaving the plurality of solder preforms within the first stencil;

aligning the first stencil with the substrate such that the plurality of solder preforms correspond in location with the plurality of terminal pads; and reflowing the plurality of solder preforms to form a plurality of solder bumps on the plurality of terminal pads of the substrate.

13. The method of claim 12 wherein as a result of removing the second stencil, a plurality of protrusions of the plurality of solder preforms are exposed, wherein the plurality of protrusions are formed by the plurality of recesses of the second stencil.

14. The method of claim 13 wherein during the step of aligning, the plurality of protrusions are brought into physical contact with the plurality of terminal pads.

15. The method of claim 14 wherein the step of aligning the first stencil with the substrate comprises providing a spacer between the substrate and the first stencil.

16. The method of claim 12 wherein the step of providing a first stencil comprises providing a first stencil wherein each opening of the plurality of openings has a tapered sidewall.

17. The method of claim 16 wherein the step of aligning the first stencil with the substrate comprises aligning the first stencil over the substrate such that the tapered sidewall of each opening tapers inward to facilitate transfer of the solder from the first stencil to the plurality of terminal pads on the substrate during the step of reflowing the plurality solder preforms.

18. A method for forming bumps on a substrate comprising the steps of:

providing a semiconductor substrate having a plurality of metal pads;

providing a stencil having a plurality of openings corresponding in pattern to the plurality of metal pads;

filling the plurality of openings in the stencil with a solder;

providing a spacer between the stencil and the semiconductor substrate and positioning the stencil over the semiconductor substrate and spacer such that the plurality of openings with the solder therein is aligned to the plurality of metal pads;

reflowing the solder in the plurality of openings to form a solder bump on each of the plurality of metal pads; and removing the spacer from the semiconductor substrate.

19. The method of claim 18 further comprising the step of reflowing the solder within the stencil to form a plurality of solder preforms, prior to positioning the stencil over the semiconductor substrate.

20. The method of claim 19 wherein as a result of reflowing the solder within the stencil to form a plurality of solder preforms, each solder preform has a protrusion, and wherein the step of positioning comprises positioning the stencil over the semiconductor substrate such that the protrusion from each solder preform is in contact with a metal pad of the plurality of metal pads.

* * * * *